United States Patent [19]

Pfaff

[11] Patent Number: 4,869,674
[45] Date of Patent: Sep. 26, 1989

[54] CRADLE FOR ELECTRONIC DEVICE PACKAGE

[76] Inventor: Wayne K. Pfaff, 309 Steeplechase, Irving, Tex. 75062

[21] Appl. No.: 198,286

[22] Filed: May 25, 1988

[51] Int. Cl.⁴ .................................... H01R 23/72
[52] U.S. Cl. .................................... 439/70; 206/328; 439/526
[58] Field of Search .................. 439/68–73, 439/525, 526, 893; 361/403, 405, 417, 418; 206/328, 334; 174/52.4, 138 G

[56] References Cited

U.S. PATENT DOCUMENTS

| | | | |
|---|---|---|---|
| 3,407,925 | 10/1968 | Ruehlemann | 206/328 |
| 3,601,699 | 8/1971 | Norton, Jr. | 439/660 |
| 4,417,095 | 11/1983 | Beun | 174/52.4 |
| 4,491,378 | 1/1985 | Crawford | 439/59 |
| 4,591,951 | 5/1986 | Iwamoto et al. | 361/417 |

Primary Examiner—Neil Abrams
Attorney, Agent, or Firm—Kanz, Scherback & Timmons

[57] ABSTRACT

The leads of surface-mountable electronic device packages are protected against damage from inadvertent bending by storage in a two-piece cradle. A plurality of peripheral ribs interdigitate with the leads to maintain preferred lead orientation leaving the free end of each lead exposed for electrical contact from outside the cradle.

23 Claims, 4 Drawing Sheets

Fig. 1

CRADLE FOR ELECTRONIC DEVICE PACKAGE

Packaging of integrated circuits has evolved for certain high-density applications from traditional DIP configurations, which have leads adapted for insertion into holes in circuit boards, to various electronic device packages known as chip carriers which obviate the need for lead insertion. Such chip carriers have flat, generally rectangular plastic or ceramic bodies which encapsulate an integrated circuit chip. The chip carriers may have small peripheral leads or contact pads in lieu of leads and, in either case, mounting of the device and interconnection of the leads or contacts with other circuitry occurs directly on the surface of a printed circuit board.

There are several types of surface-mountable chip carriers. A truly leadless variety has contact pads at the edges of the carrier body. A second type has so-called "J-leads" which emerge from an edge of the carrier body and are bent around toward the bottom surface of the body in a J-shaped configuration. A third and more recent type of chip carrier design has short S-shaped leads, sometimes referred to as gullwing leads, wherein the leads emerge from an edge of the carrier body and bend downwardly and then outwardly to form small feet for contacting the surface of a circuit board. Mounting is achieved by bonding the feet to circuitry interconnection pads on the surface of the circuit board or card.

The present invention addresses the problems particularly associated with handling and testing surface-mountable chip carriers having S-shaped leads. A major problem with such leads is their tendency to be deformed inadvertently during handling, leaving them out of proper position for mounting on the surface of a printed circuit board or the like. In accordance with the present invention, a cradle is provided for retaining the chip carrier and securing the leads in a predetermined position whereby damage to or bending of the leads is avoided during handling and testing prior to final assembly of the chip carrier onto a circuit board. The cradle, however, permits access to the leads for electrical testing of the device within the chip carrier while retaining the leads in their desired positions.

Various advantages and other features of the present invention will become more readily understood upon consideration of a presently preferred embodiment of the cradle described in conjunction with the accompanying drawing wherein.

Figure 1:
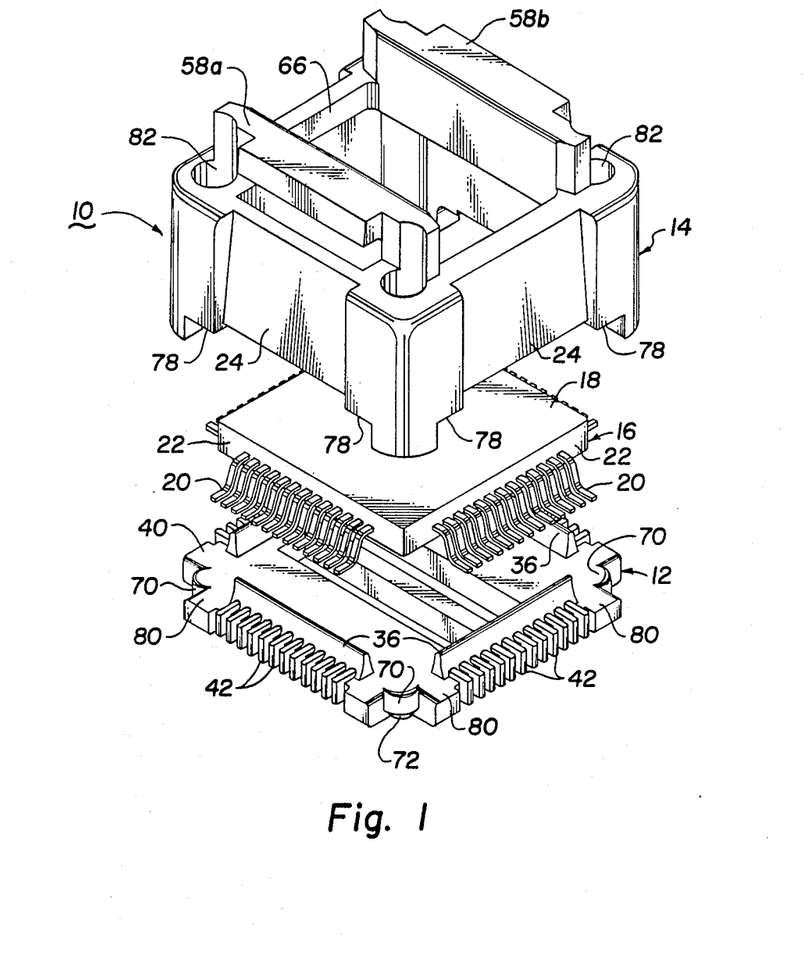
FIG. 1 is a disassembled perspective view of the preferred embodiment of the cradle of the invention and a chip carrier.

As illustrated in FIG. 1, a cradle in accordance with the present invention is indicated generally by the reference numeral 10. The cradle 10 has a base or support member 12 and a lid or cover 14, both of which can be manufactured using conventional plastic molding techniques. The base 12 and lid 14 are secured together to retain an electronic device package 16 in a predetermined position therein as seen in FIG. 2.

The electronic device package 16 is manufactured in accordance with known techniques and includes a rectangular body 18 of plastic or ceramic which encapsulates an integrated circuit chip or the like (not shown). Peripheral leads 20, which are interconnected internally with the integrated circuit chip, emerge from the body 18 preferably from each of its four edges 22. FIG. 1 illustrates, by way of example, an embodiment designed to accommodate an electronic device package 16 having a total of fifty-two peripheral leads arranged thirteen to an edge. However, it will be understood that the invention has application to electronic device packages having any number of leads and arrangements thereof.

Figure 2:
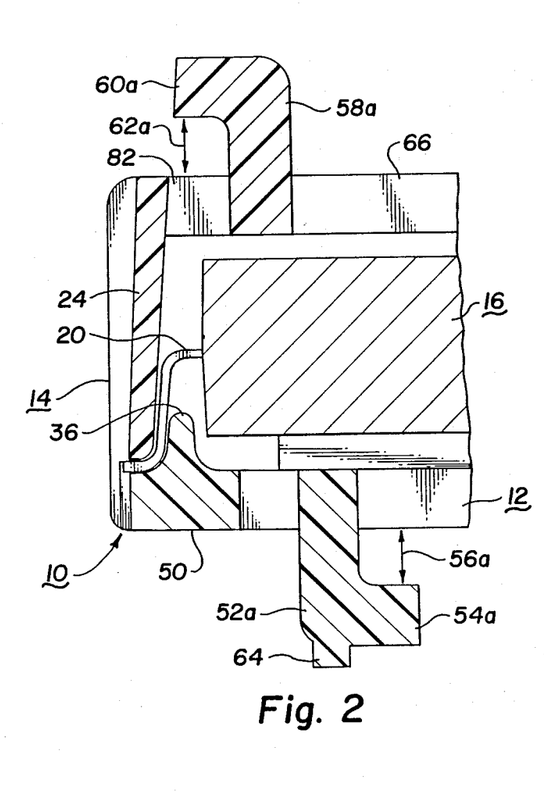
FIG. 2 is a vertical cross-sectional view of the left half of the cradle of FIG. 1 with a chip carrier nested therein.
Figure 2A:
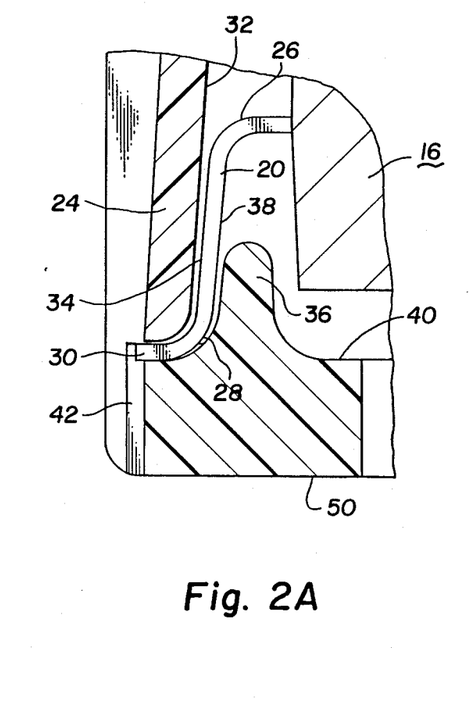
FIG. 2A is an enlarged view of a portion of FIG. 2.

When the electronic device package 16 is retained within the cradle 10, it is preferably suspended by its leads 20 in the manner illustrated in FIGS. 2 and 2A. At the periphery of the lid 14 are four similar side walls 24, the lower ends of which hold the leads 20 snugly against outer surfaces of the base 16. Each lead 20 emerges from the device package 16 horizontally in the orientation shown, then bends downwardly at a knee 26 and extends beyond the lower surface of the device package 16 to a heel 28 where it bends horizontally outwardly terminating in a free end or foot 30.

Figure 3:
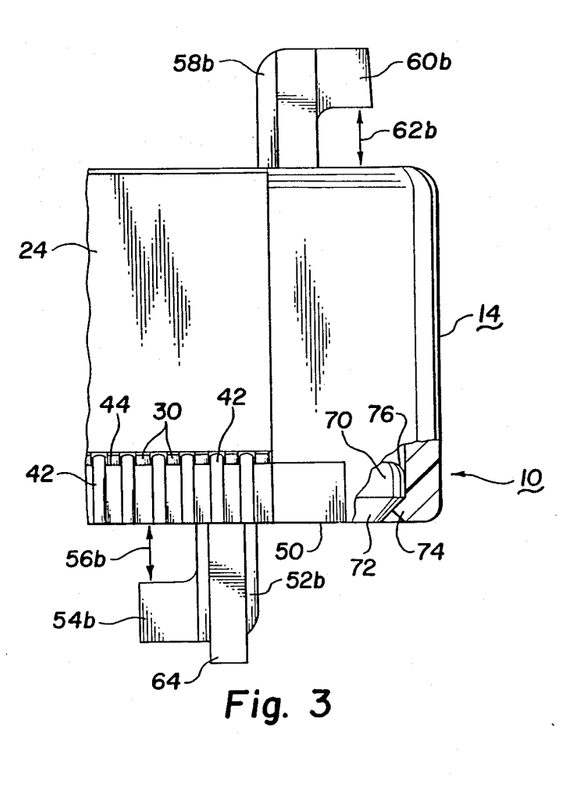
FIG. 3 is a side elevational view, partially broken away, of the right half of the cradle of FIG. 1 with a chip carrier nested therein.
Figure 3A:
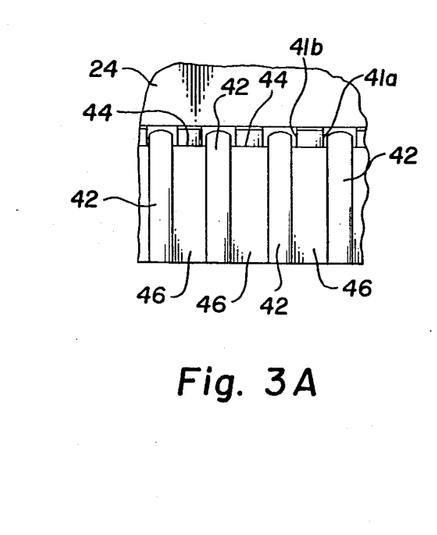
FIG. 3A is an enlarged view of a portion of FIG. 3.

As exemplified in FIG. 2A, the wall 24 has an inner surface 32 which confines outer surface 34 of lead 20 between the knee 26 and the concave portion opposite the heel 28. An elongated bar 36, which is one of four disposed at the periphery of the base 12, confines inner surface 38 of lead 20 upwardly from the heel 28. The base 12 has oppositely disposed major surfaces 40 and 50. The free end 30 of lead 20 is confined between an outer portion of the upper surface 40 and the lower end of the wall 24. Referring to FIGS. 3 and 3A, the free end 30 of each lead is constrained against lateral movement by adjacent ribs 42. The ribs 42 are adapted to interdigitate with the leads 20 as can be appreciated from the perspective of FIG. 1. An extension of the upper surface 40 outward from the bars 36 forms surface portions which support the free ends 30. Thus a channel is formed where the free ends 30 lie between adjacent ribs 42. The channel extends downwardly between adjacent ribs along a vertical edge 46 of the base 12 where contacts from a test socket may be received to make electrical contact with the free ends 30 as will be described more fully below. As seen in FIGS. 1 and 3A the surfaces of the ribs 42 are curved or tapered to facilitate guiding the leads 20 into the horizontal portions of the channels and guiding the contacts of the test socket into the vertical portions of the channels.

As seen in FIGS. 1 and 3 the base 12 and the lid 14 have interlocking parts at their corners. The base 12 has rounded corner members indicated generally by reference numerals 70. Each corner member 70 has a lower locking surface 72 which tapers inwardly toward the lower surface 50 of the base 12. The locking surface 72 preferably defines a surface portion of a cone. The lid 14 has projections 74 of complementary shape for mating with the locking surfaces 72 at corresponding corners. Each corner member 70 also has a curved upper edge 76 which cooperates with the corresponding projection 74. When the base 12 and lid 14 are brought together, the projections 74 first engage the curved surfaces 76 causing the corners of the lid 14 to spread open slightly until the projections 74 snap inwardly into engagement with the locking surfaces 72 as seen in FIG. 3. The lid 14 has shoulder portions 78 at each corner which rest snuggly on portions 80 on the upper surface 40 adjacent the corners of the base 12. When the base 12 and lid 14 are mated together as shown in FIGS. 2 and 3, the leads 20 are trapped between the peripheral walls 24 of the lid, bars 36 and the outer portions 44 of the upper surface 40 of the base.

FIGS. 2 and 3 illustrate parts for manipulating the cradle 10 from above or below. The base 12 has a lower major surface 50 beyond which complementary members 52a and 52b extend. The members 52a and 52b have inwardly facing rails or flange portions 54a and 54b which, together with the lower surface 50, define slots 56a and 56b. Likewise, extending above the lid 14 are complementary members 58a and 58b which have outwardly facing rails or flange portions 60a and 60b defining slots 62a and 62b, respectively. It will be appreciated that the cradle 10 can be carried from above or below by transport means (not shown) extending into respective complementary slots. Furthermore, by pulling downwardly on members 52a and 52b or upwardly on members 58a and 58b, the cradle can be opened by automated equipment to retrieve the device package 16 in preparation for permanent installation on a printed circuit board or the like.

By arranging the lower rails 54a and 54b facing inwardly and the upper rails 60a and 60b facing outwardly, stacking of cradles for storage can be facilitated. The lower members 52a and 52b of one cradle can nest within the upper members 58a and 58b of a second cradle and so on with successive cradles. The members 52a inner surfaces 66 of another cradle to assist in alignment of cradles in a stacked arrangement.

As illustrated in FIG. 1, the lid 14 preferably has openings 82 at the corners registered vertically above the portions of the upper surface 40 adjacent the corners 70. This arrangement enables separation of the lid and the base by automated equipment from above by inserting rods (not shown) through the openings 82 to push down on the base 12 at the corners 70 while pulling upwardly on the lid 14 using members 58a and 58b. The force applied to the base in this manner is localized at the points where the projections 74 interact with the corners 70, thus reducing stress on the base and extending its useful life.

Figure 4A:
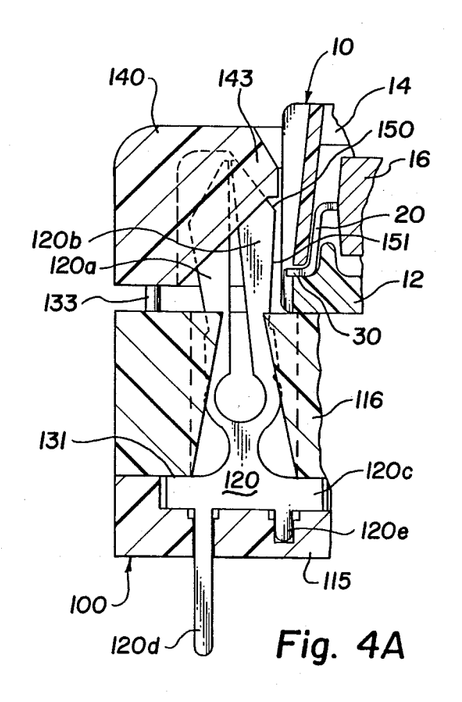
FIG. 4A is a vertical cross-sectional view, partially broken away, of an edge of the cradle of FIG. 1 nested in a test socket with the contacts thereof in an open position.

The features of the cradle 10 which permit testing of an electronic device while nested within the cradle are hereinafter described with particular reference to FIGS. 4A and 4B. The cradle 10 is inserted into a housing or test socket 100, only the left side of which is shown. A complete description of a suitable test socket is provided in U.S. Pat. No. 4,491,377, the subject matter of which is incorporated herein by reference.

The test socket housing 100 includes a base support 115, an intermediate support housing 116, a spreader cap 140 and a plurality of conductors 120, only one of which is illustrated. The base support 115 and intermediate support housing 116 are held firmly together by corner studs (not shown) thereby securing the conductors 120 therebetween by means of shoulders 131 as described more fully in the aforementioned patent. The conductors 120 include resilient contacts or blades 120a and 120b extending from a common horizontal portion 120c. The conductor 120 also includes a shank portion 120d and a stud 120e extending downwardly from the horizontal portion 120c. The shank portion 120d extends through and below the base support 115 for insertion into a printed circuit board or the like (not shown). The stud 120e extends into a recess in the base support 115 to assist in aligning the conductor 120. The blades 120a and 120b extend up into the spreader cap 140. Blade 120b is positioned for making electrical contact with an electronic device or chip carrier.

Blade 120a is redundant in the views illustrated herein but provides symmetry so that a single conductor part can be used in two different shank orientations as described more fully in the aforementioned patent.

The spreader cap 140 reciprocates vertically with respect to the support members 115 and 116. Vertical movement of the spreader cap 140 is guided by corner posts 133 which extend into apertures (not shown) in the cap. The cap 140 includes a downwardly projecting lip 143 which cams against an outwardly inclined edge 150 of the blade 120b to urge the blade 120b to an open position when the cap is forced downwardly as seen in FIG. 4A. It will be appreciated that a plurality of peripheral blades similar to the blade 120b are likewise spread open in the housing 100 to permit insertion of a device into the housing through a central opening defined by the inner edges of the lip 143.

In accordance with the present invention, the device which is inserted into the housing 100 is the cradle 10 with electronic device package 16 nested therein. The free ends 30 of each of the leads 20 of the device 16 face respective blades 120b.

Figure 4B:
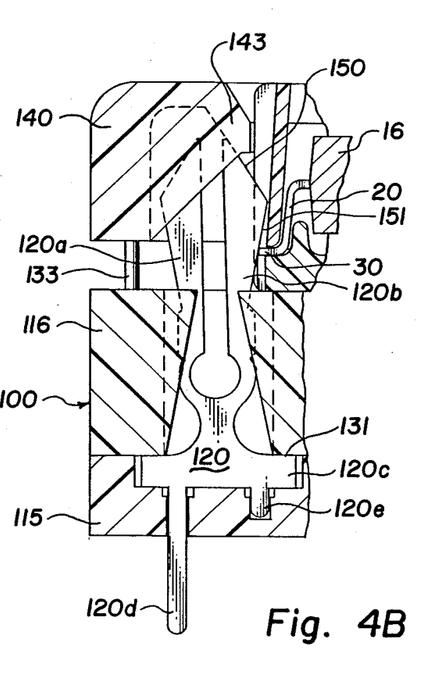
FIG. 4B is a view similar to FIG. 4A showing the contacts of the test socket in a closed position.

With reference to FIG. 4B, the blades 120b spring back into a closed position when the downward force from the cap 140 is released. Preferably, the spring force of the blades is used to push the cap 140 upwardly. However, those skilled in the art will appreciate that additional springs or resilient means could be added if needed, preferably at the corner posts 133.

When the blades 120b spring back to the normally closed position, the edges 151 of the blades make contact with the free ends 30 of the leads 20. The blades 120b register with the channels formed between adjacent ribs 42 as will be appreciated from the view of FIG. 1. The ribs 42 not only separate and hold the leads in a trapped poistion, they also guide the blades 151 into contact with the ends of the leads. Thus, the arrangement shown in FIGS. 4A and 4B enables testing, burn-in, etc., of the electronic device in device package 16 by means of a test socket 100 while the package 16 is nested in the cradle 10.

The foregoing description of the present invention provides a needed solution to the problem of handling certain electronic device packages with delicate leads. Although a preferred embodiment of the invention has been described in detail, it will be understood that various changes, substitutions and alterations can be made therein without departing from the spirit and scope of the invention as defined by the appended claims.

What is claimed:

1. A cradle for an electronic device package having a flat generally rectangular body and a plurality of peripheral leads adapted for surface mounting on a circuit board, each lead having a portion extending downwardly to form a heel and a free end extending outwardly from the heel, said cradle comprising:

(a) a base member having a major surface, first means disposed adjacent the periphery of said base member for supporting the heels of leads extending from the periphery of an electronic device package, and second means disposed at the periphery of said base member for confining the leads to maintain the leads in a predetermined lateral position; and (b) closure means for mating with said base member to secure the electronic device package between said base member and said closure means, said closure means having wall means at the periphery thereof for cooperating with said first means to confine the heels of the leads therebetween.

2. A cradle as defined in claim 1 wherein said second means comprises ribs extending outwardly from the periphery of said base member for interdigitating with the free ends of the leads.

3. A cradle as defined in claim 1 wherein said first means comprises elongated bars disposed on the major surface of the base member defining an area above which the body of the electronic device package is supported, each bar having an outer surface extending upwardly from said major surface of said base member to confine the heels of said leads.

4. A cradle as defined in claim 3 wherein:
(a) said second means comprises ribs extending outwardly from the periphery of said base member adapted to inerdigitate with the free ends of said leads; and
(b) said major surface of said base member includes portions between said ribs for supporting the free ends of said leads while leaving the free end of each lead exposed for electrical contact from outside the cradle.

5. A cradle as defined in claim 1 wherein said base member includes locking surfaces and said closure means includes projections cooperating with said locking surfaces when said base member and said closure means are urged together causing the projections to resiliently snap into engagement with the locking surfaces so that said leads are trapped between said wall means and said first means.

6. A cradle as defined in claim 5 wherein said closure means has openings registered vertically above the corners of said base member.

7. A cradle as defined in claim 1 wherein said base member includes means for manipulating the cradle.

8. A cradle as defined in claim 7 wherein the manipulating means comprises rails extending from said base member defining oppositely disposed parallel slots.

9. A cradle as defined in claim 1 wherein said closure means includes means for manipulating the cradle.

10. A cradle as defined in claim 9 wherein the manipulating means comprises rails extending from said closure means defining oppositely disposed parallel slots.

11. A cradle for an electronic device package having a plurality of leads extending outwardly from at least one edge thereof, said cradle comprising:
(a) a support member having first and second oppositely disposed major surfaces and means defining a plurality of substantially parallel channels along a peripheral edge of said support member;
(b) cover means mating with said support member for securing said leads within said channels leaving the end of each lead exposed for electrical contact thereto from outside the cradle; and
(c) means for positioning an electronic device package adjacent said first major face with its leads positioned within said channels including elongated bars at the periphery of said support member and walls at the periphery of said cover means cooperating with said bars to confine portions of said leads therebetween.

12. A cradle as defined in claim 11 wherein said channels define portions along the first major surface within which the free ends may be confined and portions along the peripheral edge of said support member for receiving contacts of a test apparatus.

13. A cradle as defined in claim 11 including means extending from said second major surface for manipulating the cradle.

14. A cradle as defined in claim 13 wherein the manipulating means includes flange means projecting therefrom for forming substantially parallel elongated slots along the second major surface.

15. A cradle as defined in claim 11 including means extending from the cover means for manipulating the cradle.

16. A cradle as defined in claim 15 wherein the manipulating means includes flange means projecting therefrom forming substantially parallel elongated slots along edges of the cover means.

17. A cradle as defined in claim 11 including:
(a) first means extending downwardly from the support member for manipulating the cradle; and
(b) second means extending upwardly from the cover means for manipulating the cradle, said first means and said second means constructed and arranged such that the first means of one such cradle may nest with the second means of a second such cradle.

18. A cradle as defined in claim 17 wherein said first means includes downwardly extending means for maintaining vertical alignment of two such cradles when such cradles are arranged in a stacked arrangement.

19. The combination comprising:
(a) an electronic device package having a body encasing electronic circuitry and a plurality of the peripheral leads extending downwardly and outwardly from the body to provide outwardly extending free ends adapted for mounting on the surface of a circuit board;
(b) a cradle for retaining said electronic device package and securing the leads in predetermined positions with the free ends thereof exposed at edges of cradle; and
(c) a mounting housing for receiving said cradle and interconnecting said electronic circuitry with other circuitry, said mounting housing including a plurality of conductors secured therein, each conductor having a first portion extending below the housing for insertion into a circuit board and a second portion defining resilient means contacting a lead of the electronic device package.

20. The combination defined in claim 19 wherein said mounting housing includes means for positioning the resilient contacts to an open position to permit the cradle to be inserted into the housing and for positioning the resilient contacts in a closed position contacting the free ends of said leads.

21. The combination comprising:
(a) an electronic device package having a body encasing electronic circuitry and a plurality of peripheral leads extending downwardly and outwardly from the body to provide outwardly extending free ends adapted for mounting on the surface of a circuit board; and
(b) a cradle retaining said electronic device package and securing the leads in predetermined positions with the free ends thereof exposed at edges of said cradle comprising:
  (i) a support member having first and second oppositely disposed major surfaces and means defining a plurality of substantially parallel channels for receiving said leads; and
  (ii) cover means mating with said support member having means for retaining said leads within said channels leaving the end of each lead exposed for electrical contact thereto from outside the cradle.

22. A cradle for an electronic device package having a plurality of leads extending outwardly from at least one edge thereof, said cradle comprising:
  (a) a support member having first and second oppositely disposed major surfaces and men defining a plurality of substantially parallel channels along a peripheral edge thereof;
  (b) means for positioning an electronic device package adjacent the first major surface of the support member with its leads positioned within said channels;
  (c) cover means mating with said support member for securing said leads within said channels leaving the end of each lead exposed for electrical contact thereto from outside the cradle;
  (d) first means extending downwardly from the support member for manipulating the cradle; and
  (e) second means extending upwardly from the cover means for manipulating the cradle, said first means and said second means constructed and arranged so that the first means of one such cradle may nest with the second means of a second such cradle.

23. A cradle as defined in claim 22 wherein said first means includes downwardly extending means for maintaining vertical alignment of two such cradles when such cradles are arranged in a stacked arrangement.

* * * * *

UNITED STATES PATENT AND TRADEMARK OFFICE
CERTIFICATE OF CORRECTION

PATENT NO. : 4,869,674

DATED : September 26, 1989

INVENTOR(S) : Wayne K. Pfaff

It is certified that error appears in the above-identified patent and that said Letters Patent is hereby corrected as shown below:

Column 1, line 3, insert ---This invention relates to electronic device handling systems for use during testing, storage and shipment of electronic device packages prior to assembly into end-use products. More particularly, it relates to cradles for protecting the leads of integrated circuit packages and the like from damage during the period between manufacture and final assembly onto a printed circuit board or the like.---

Column 2, line 46, between "portions" and "which" insert ---44---

Column 3, line 35, between "52a" and "inner" insert ---and 52b preferably have extended portions or tabs 64 which abut---

UNITED STATES PATENT AND TRADEMARK OFFICE
CERTIFICATE OF CORRECTION

PATENT NO. : 4,869,674

DATED : September 26, 1989

INVENTOR(S) : Wayne K. Pfaff

It is certified that error appears in the above-identified patent and that said Letters Patent is hereby corrected as shown below:

Column 7, line 18, change "men" to ---means---

Signed and Sealed this

Twenty-fifth Day of December, 1990

Attest:

HARRY F. MANBECK, JR.

*Attesting Officer*    *Commissioner of Patents and Trademarks*